(12) United States Patent
Lu et al.

(10) Patent No.: US 11,018,149 B2
(45) Date of Patent: May 25, 2021

(54) BUILDING STACKED HOLLOW CHANNELS FOR A THREE DIMENSIONAL CIRCUIT DEVICE

(71) Applicant: Intel Corporation, Santa Clara, CA (US)

(72) Inventors: Zhenyu Lu, Boise, ID (US); Roger Linsday, Boise, ID (US); Sergei V Koveshnikov, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 647 days.

(21) Appl. No.: 14/228,247

(22) Filed: Mar. 27, 2014

(65) Prior Publication Data

US 2015/0279855 A1    Oct. 1, 2015

(51) Int. Cl.
  *H01L 27/11582* (2017.01)
  *H01L 27/1157* (2017.01)
  *H01L 27/11556* (2017.01)

(52) U.S. Cl.
  CPC ..... *H01L 27/11582* (2013.01); *H01L 27/1157* (2013.01); *H01L 27/11556* (2013.01)

(58) Field of Classification Search
  CPC ........... H01L 27/11524; H01L 27/1157; H01L 27/11578
  See application file for complete search history.

(56) References Cited

U.S. PATENT DOCUMENTS

| 4,920,065 | A | 4/1990 | Chin et al. |
| 5,479,197 | A | 12/1995 | Fujikawa et al. |
| 2001/0019890 | A1 | 9/2001 | Arakawa |
| 2006/0062897 | A1 | 3/2006 | Gu et al. |
| 2009/0146190 | A1 | 6/2009 | Fukuzumi et al. |
| 2009/0159964 | A1 | 6/2009 | Lee |
| 2009/0242966 | A1 | 10/2009 | Son et al. |
| 2010/0013049 | A1 | 1/2010 | Tanaka et al. |
| 2010/0051910 | A1* | 3/2010 | Choi ................... H01L 27/3246 257/40 |

(Continued)

FOREIGN PATENT DOCUMENTS

| KR | 20100053393 | 5/2010 |
| KR | 20100097459 | 9/2010 |

(Continued)

OTHER PUBLICATIONS

F. Francasi et al., "Plasma Assisted Dry Etching of Cobalt Silicide for Microelectronics Applications", Journal of the Electrochemical Society, vol. 143, No. 2, Feb. 1996, 1 page.

(Continued)

*Primary Examiner* — Stephen M Bradley
(74) *Attorney, Agent, or Firm* — Compass IP Law, PC

(57) ABSTRACT

A three dimensional stacked circuit device includes multiple decks of circuit elements, each deck including multiple tiers of circuit elements. Each deck includes a highly doped hollow channel extending through the deck. Below the first deck is a source conductor to drive activity of the circuit elements. Between each deck is a conductive stop layer that interconnects the hollow channel from one deck to the hollow channel of the deck adjacent to it. Thus, all hollow channels of all decks are electrically coupled to the source conductor.

1 Claim, 13 Drawing Sheets

(56) References Cited

U.S. PATENT DOCUMENTS

| | | | |
|---|---|---|---|
| 2010/0109065 A1* | 5/2010 | Oh | H01L 27/0688 257/314 |
| 2010/0133599 A1 | 6/2010 | Chae et al. | |
| 2010/0159657 A1 | 6/2010 | Arai et al. | |
| 2010/0224929 A1 | 9/2010 | Jeong et al. | |
| 2010/0237400 A1 | 9/2010 | Aoyama | |
| 2010/0270529 A1 | 10/2010 | Lung | |
| 2011/0002178 A1 | 1/2011 | Hwang et al. | |
| 2011/0018094 A1 | 1/2011 | Chapman et al. | |
| 2011/0065270 A1* | 3/2011 | Shim | H01L 27/11556 438/589 |
| 2011/0085377 A1 | 4/2011 | Mizukami et al. | |
| 2011/0151667 A1 | 6/2011 | Hwang et al. | |
| 2012/0008400 A1 | 1/2012 | Fukuzumi et al. | |
| 2012/0098051 A1 | 4/2012 | Son et al. | |
| 2012/0104484 A1 | 5/2012 | Lee et al. | |
| 2012/0241842 A1 | 9/2012 | Matsuda | |
| 2012/0273862 A1* | 11/2012 | Tanzawa | H01L 27/11524 257/314 |
| 2013/0044531 A1* | 2/2013 | Baek | G11C 5/025 365/72 |
| 2013/0175494 A1 | 7/2013 | Collins et al. | |
| 2013/0215679 A1* | 8/2013 | Lee | G11C 16/10 365/185.17 |
| 2013/0330891 A1 | 12/2013 | Chang et al. | |
| 2014/0024189 A1* | 1/2014 | Kim | H01L 29/66666 438/287 |
| 2014/0029352 A1 | 1/2014 | Tanzawa | |
| 2014/0061779 A1 | 3/2014 | Kim et al. | |
| 2014/0167131 A1 | 6/2014 | Lu et al. | |
| 2014/0252363 A1 | 9/2014 | Liu et al. | |
| 2014/0264525 A1* | 9/2014 | Takahashi | H01L 27/115 257/314 |
| 2014/0264533 A1 | 9/2014 | Simsek-Ege et al. | |
| 2015/0079742 A1 | 3/2015 | Pachamuthu et al. | |
| 2015/0106777 A1 | 4/2015 | Tsai | |
| 2015/0162246 A1 | 6/2015 | Zhu et al. | |
| 2015/0340095 A1 | 11/2015 | Tanzawa | |

FOREIGN PATENT DOCUMENTS

| | | |
|---|---|---|
| KR | 20100100397 A | 9/2010 |
| KR | 20100133558 A | 12/2010 |
| KR | 20110034816 | 4/2011 |
| KR | 20120029291 | 3/2012 |
| KR | 20140011872 A | 1/2014 |

OTHER PUBLICATIONS

International Search Report and Written Opinion for PCT Patent Application No. PCT/US2015/048292, dated Nov. 30, 2015, 16 pages.

International Search Report and Written Opinion Received for Patent Application No. PCT/US2013/047002, dated Oct. 18, 2013, 9 Pages.

Jaehoon Jang, et al., "Vertical Cell Array using TCAT (Terabit Cell Array Transistor) Technology for Ultra High Density NAND Flash Memory", Symposium on VLSI Technology Digest of Technical Papers, 2009, 2 pages.

KR Williams, "Etch Rates for Micromachining Processing-Part II", Journal of Microelectro mechanical Systems, vol. 12, No. 6, Dec. 2003, table III, 1 page.

International Search Report and Written Opinion for PCT Patent Application No. PCT/US2015/023179, dated Jun. 30, 2015, 15 pages.

P. Arun, et at., Large Grain Size Dependence of Resistance of Polycrystalline Films, Department of Physics and Astrophysics, University of Delhi, Delhi 110 007, India, 17 pages.

Search Report of R.O.C. Patent Application No. 104104772, completed Apr. 27, 2016, 1 page.

International Preliminary Report on Patentability, PCT/US2015/023179, dated Oct. 6, 2016, 14 pages.

Examination Report for German Patent Application No. 112015000524.2, dated Oct. 19, 2016, 178 pages.

Organized Translation of Notice of Reasons for Japanese Patent Application No. 2016-552941, dated Aug. 24, 2017, 3 pages.

Extended European Search Report for Patent Application No. 15768204.8, dated Oct. 20, 2017, 8 pages.

Final Office Action for U.S. Appl. No. 14/979,304, dated Apr. 26, 2018, 18 pages.

Japanese and English Translation of Japanese Office Action for Patent Application No. 2016-552941, dated Dec. 27, 2017, 5 pages.

Chinese and English Translation of P.R. China State Intellectual Property Office First Office Action for Patent Application No. 201580010807.6, dated Jul. 10, 2018, 26 pages.

Korean and English Translation of the Notice of Preliminary Rejection for Patent Application No. 10-2016-7022725, dated May 31, 2018, 7 pages.

Summary of KR Office Action, Patent Application No. 10-2016-7022725, dated Nov. 18, 2017, 1 page.

Chinese and English Translation of P.R. China State Intellectual Property Office Second Office Action for Patent Application No. 201580010807.6, dated Jan. 11, 2019, 20 pages.

\* cited by examiner

BUILDING STACKED HOLLOW CHANNELS FOR A THREE DIMENSIONAL CIRCUIT DEVICE

FIELD

Embodiments of the invention are generally related to stacked circuit devices, and more particularly to creating stacked hollow channels for a three dimensional circuit device.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2014, Intel Corporation, All Rights Reserved.

BACKGROUND

Computing and electronic devices continue to shrink in size, even as higher performance and storage capacity is expected from the devices. Additionally, the more components and the greater the real estate used, the more the devices consume power. Size and power consumption are significant factors in electronic devices, especially handheld and mobile devices. Recent developments in electronic device manufacturing offer possibilities to create electronic devices that have higher densities. However, the practical limits on certain processing techniques constrain the possibility of achieving further density increases.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIGS. 2A-2I are block diagrams of an embodiment of a stacked circuit.

Figure 1:
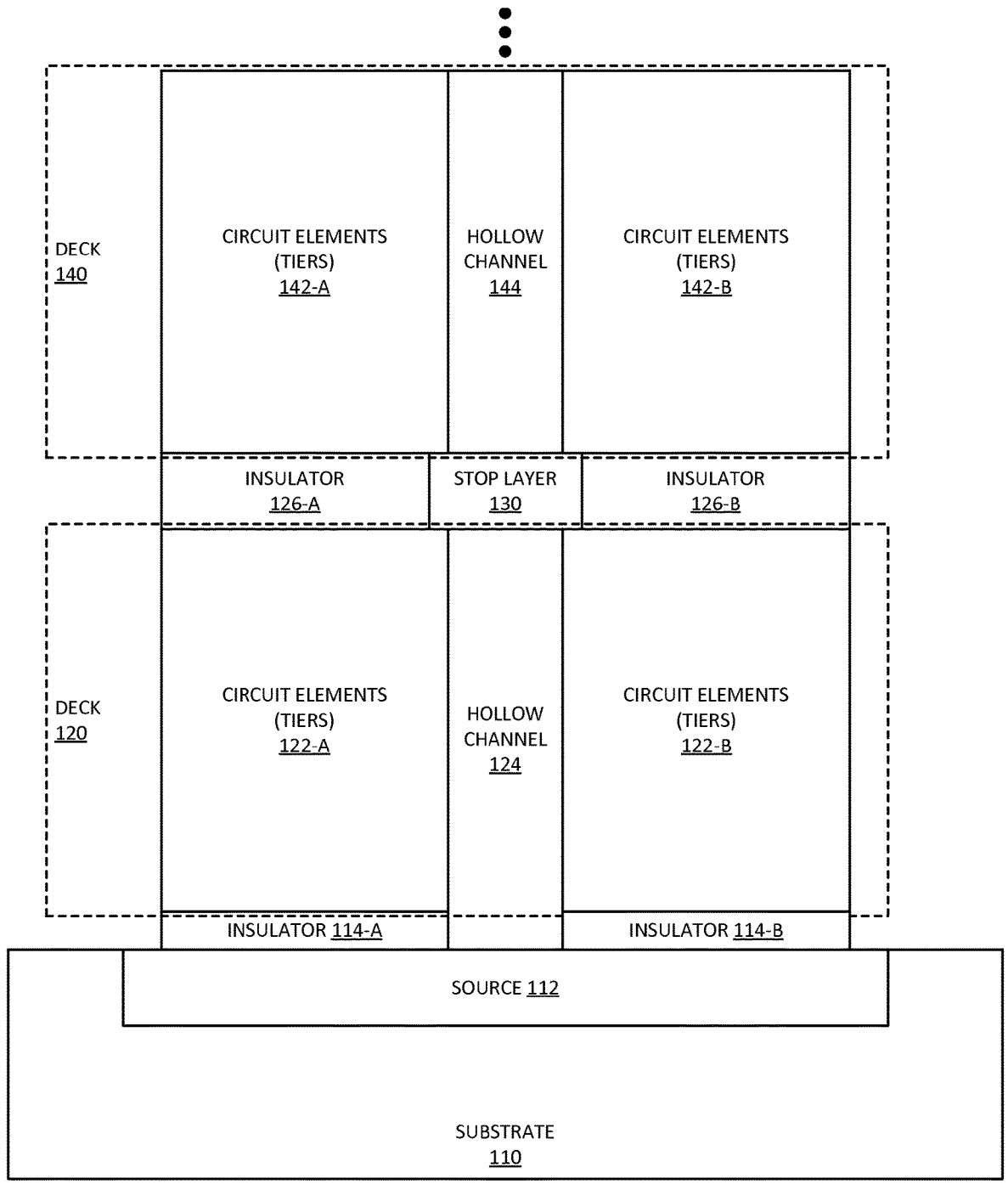
FIG. 1 is a block diagram of an embodiment of a stacked circuit having a hollow channel.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, increased density for circuit components can be achieved with three dimensional stacking. More particularly, a three dimensional stacked circuit device includes multiple decks of circuit elements that are electrically connected by a highly doped hollow channel and a conductive stop layer. The hollow channel and stop layer enable stacking multiple decks. Each deck includes multiple tiers of circuit elements, allowing for the stacking of circuit elements (e.g., vertical stacking). The first deck is directly adjacent a source conductor includes a high doped hollow channel that electrically couples to the source conductor, which drives activity of the circuit elements. The highly doped hollow channel of each deck extends from one end of the deck to the other end of the deck (e.g., top to bottom in a vertical stack, or side to side in a horizontal stack/row). Between each deck is a conductive stop layer that interconnects the hollow channel of one deck to the hollow channel of the deck adjacent to it. Thus, all hollow channels of all decks are electrically coupled to the source conductor.

In one embodiment, the circuit elements are NAND memory cells. Thus, the circuit device is a three dimensional (3D) memory device. In one embodiment, the hollow channels are built by creating straight pillars through the multiple tiers of each deck. The chemistry traditionally used in creating straight pillars has limitations on how deep the pillars can be (e.g., how many of the tiers can be etched through) with straight pillar profiles and uniform stopping of the etch (i.e., all pillars have the same depth). For example, in the case of many tiers of wordlines stacked together (e.g., 36 tiers), an extremely high aspect ratio will be presented, which limits the ability of current techniques to achieve the desired processing. As described herein, multiple decks can be separately created with separate pillars created in each deck at a time. Thus, the number of tiers needed to be etched at a time is limited, but the overall number of tiers can be greater than with traditional techniques because multiple decks can be stacked.

It will be understood that to stack multiple decks of tiers of circuit elements, the circuit will need a conductive stop layer. The conductive stop layer provides the conductivity needed to electrically couple the upper deck(s) to the source conductor below the first deck. To be conductive, the stop layer can be a metal alloy or highly doped material. However, it will be understood that using a highly conductive stop layer can lead to diffusion of carriers into the hollow channels. Diffusion of electrical carriers into traditional hollow channels would lead to increased irregularity in the performance profile of the hollow channel. By heavily doping the hollow channel, the diffusion of carriers from the conductive stop layer will not have a negative effect on the performance profile of the hollow channel.

High doping of the hollow channel will notably increase string current and will minimize the source-drain gradient difference. Thus, the high doping can minimize the difference in performance or operation of the different circuit elements. However, the high doping can limit control of the turn off behavior in the circuit elements, especially when the deck has many circuit elements. In one embodiment, the highly doped hollow channel is kept thin. Minimizing the thickness of the channel can allow more controlled turn off behavior of the circuit elements. For example, the channel can be limited in thickness by the space charge region width of a fully depleted layer for the circuit architecture of the particular circuit element. In one embodiment, the channel thickness is restricted to be much smaller than the pillar radius or width. For example, the channel thickness can be one fifth or smaller than the pillar width or the width of the entire channel (width being a measurement across the channel as seen from a cross-section of the hollow channel). A thinner channel can improve device-to-device uniformity. In one embodiment, the use of oxidation can adjust the thickness of the channel and further improve off current performance of the circuit elements.

The following descriptions refer to the accompanying drawings. It will be understood that the drawings do not necessarily set out elements or components to scale. Certain elements are intentionally drawn out of proportion for purposes of illustration and discussion. It will also be understood that the specific examples refer to vertical stacking of decks, one on top of the other. In one embodiment, the circuits could be configured horizontally.

FIG. 1 is a block diagram of an embodiment of a stacked circuit having a hollow channel. System 100 represents an electronic circuit device that uses multiple decks of circuit elements. Instead of processing all circuit elements in a single stack and attempting to create a channel to operate all the circuit elements, system 100 is processed in layers, with multiple decks of circuit elements.

Substrate 110 represents a substrate or semiconductor platform on which the electronic circuit is processed. System 100 represents a cross section of the electronic circuit, and it will be understood that typically many such circuits would be processed simultaneously on a semiconductor wafer. The processing creates (e.g., deposits) source conductor 112 in substrate 110. Source conductor 112 can activate or control the circuit operation of the circuit elements of system 100. Source conductor 112 is a highly conductive material, such a metallic material (e.g., tungsten silicide (WSix)) or other material with many high-mobility carriers. It will be understood that not all circuit elements for a functional circuit are illustrated in system 100.

Insulator 114 (elements 114-A and 114-B) can provide a barrier between source 112 and the first deck, deck 120. Deck 120 includes circuit elements 122 (elements 122-A and 122-B). Circuit elements 122 are created in tiers within deck 120. Thus, multiple circuit elements 122 are stacked vertically adjacent to each other within deck 120. Deck 120 can include anywhere from a few circuit elements 122 to more than 30 circuit elements (e.g., 36 or 38 memory cells). Hollow channel 124 extends the entire/height length of deck 120 to source 112, thus providing electrical connectivity from source 112 to circuit elements 122.

Deck 140 is the second deck of system 100, and is built or processed adjacent to deck 120. Deck 140 includes circuit elements 142 (elements 142-A and 142-B). It will be understood that the multiple tiers of circuit elements, 122 and 142, can be processed in steps or layers. Thus, the number of tiers desired can determine how many layers of processing are performed. In one embodiment, circuit elements 122 and 142 are each stacked vertically as tiers of circuit elements within their respective decks. In one embodiment, the processing that creates circuit elements 142 is the same as the processing that creates circuit elements 122, but performed in a different deck separated by certain decks processing operations.

In one embodiment, the processing creates insulator 126 (elements 126-A and 126-B) on deck 120 to provide a separator on which deck 140 can be processed. Stop layer 130 is processed at the end of hollow channel 124, and allows electrical connectivity of hollow channel 144 of deck 140 to hollow channel 124 of deck 120, and thus to source 112. It will be understood that insulator 126 can be a single insulator layer that surrounds stop layer 130. Similarly, hollow channels 124 and 144 can be surrounded by circuit elements 122 and 142, respectively. Thus, the designation of 'A' and 'B' elements is merely for illustrative purposes to illustrate the different sides of the circuit as seen from a cross section through the hollow channels.

In one embodiment, hollow channels 124 and 144 are created as deep, narrow holes or pillars in the material. It will be understood that when source 112 is a metallic layer, the processing can include etching processes that will produce a good pillar with uniform properties to be able to generate hollow channel 124. To be able to build deck 140 on deck 120, stop layer can also be a highly conductive material or metallic material that would allow a deterministic stopping to an etch process. Thus, hollow channel can likewise be deterministically generated with a uniform depth and properties as other pillars (not specifically shown) that would also be in deck 140. In one embodiment, insulator 126 is made relatively thick compared to a thickness needed to separate tiers of circuit elements. The thickness of insulator 126 can allow the use of a two-step etch process (see FIG. 2G for more detail) to provide more uniform hollow channel properties for deck 140.

Hollow channels 124 and 144 are heavily doped, and thus have relatively high carrier mobility. The heavily doped nature of the hollow channels eliminates concerns of carrier diffusion from stop layer 130. In one embodiment, hollow channels 124 and 144 include thin conductor region surrounding an insulator (see FIGS. 2A-2I for more specific detail). A thin hollow channel conductor can constrain grain size of the heavily doped carrier, which can further reduce the effects of carrier diffusion.

System 100 explicitly illustrates two decks, deck 120 and deck 140. It will be understood that the separation of the elements in the different deck, as well as the high conductivity of the hollow channels and stop layer connecting the decks theoretically allows any number of decks to be stacked in system 100. In one embodiment, the number of vertical stacks is in theory unlimited, which allows much more efficient use of semiconductor die real estate. Thus, the total number of circuit elements in system 100 can be doubled, tripled, or more, relative to what the real estate would traditionally allow, based on the stacking. Referring to the example above, traditional circuit processing may allow the use of 36 tiers of memory cells on the real estate used by system 100. However, system 100 can allow the use of 72, 108, or even more tiers on the same real estate. The limitation on the number of tiers of circuit elements could thus be cost of processing the additional decks, rather than traditional limitations on the processing itself.

Thus, the processing could create another insulator layer (similar to insulator 126) and another stop layer (similar to stop layer 130) directly adjacent deck 140. The second stop layer would be adjacent to hollow channel 144, and would allow a hollow channel of a third deck to electrically couple to source 112. Thus, in one embodiment, system 100 can include a third deck of circuit elements coupled to source 112, via the stop layers and hollow channels vertically below it.

FIGS. 2A-2I are block diagrams of an embodiment of a stacked circuit. For purposes of example, FIGS. 2A-2I illustrate a three-dimensional stacked memory device, with each deck having multiple tiers of memory cells. Specifically, the example in FIGS. 2A-2I provide one example embodiment of a vertically stacked memory device, with one deck processed on top of another deck, each deck including multiple vertical tiers of memory cells. In one embodiment, such processing can occur in a "horizontal" manner, but for a device that is stacked out from a semiconductor substrate or wafer. Thus, in one embodiment, "vertical" stacking can refer to any processing that extends circuit elements out or up and away from the semiconductor substrate on which the devices are processed and/or placed for operation. Such processing allows reduced area in a plane of the semiconductor substrate to which the devices are connected, while increasing the number of devices stacked out from the semiconductor substrate.

Figure 2A:
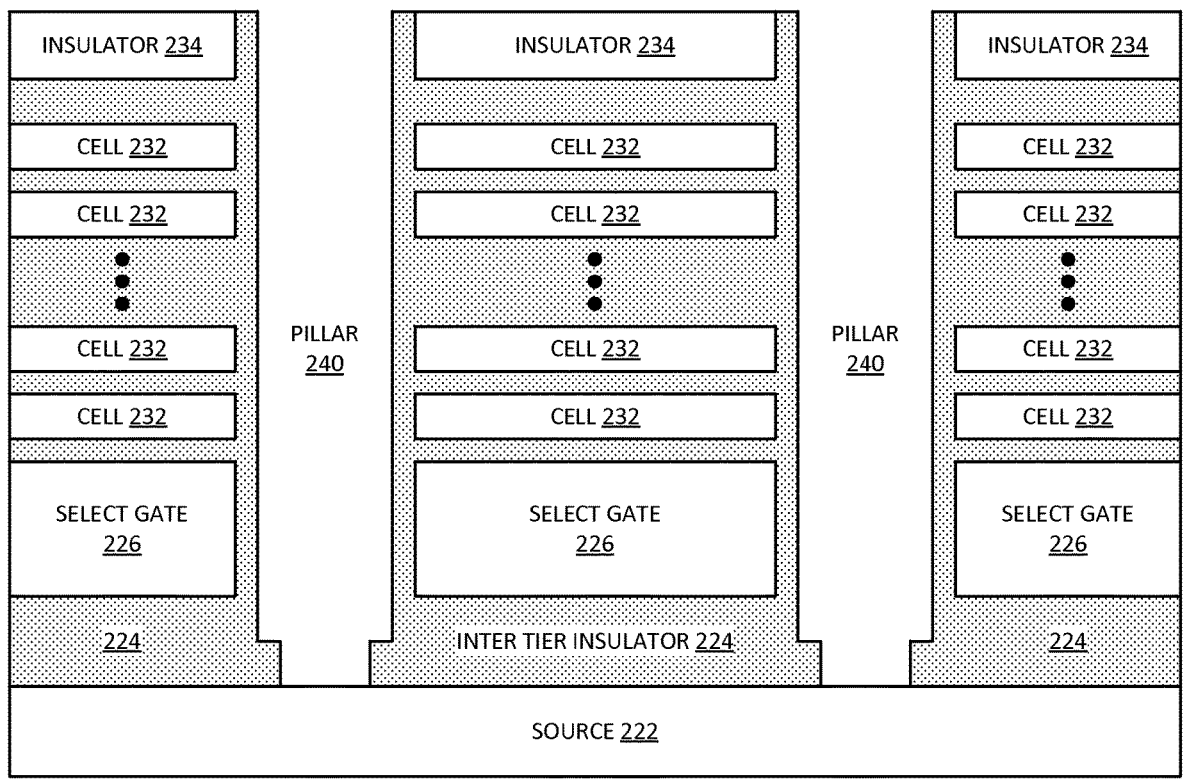

FIG. 2A illustrates circuit state 202, in which multiple tiers or cells 232 have been processed over source 222. Insulator 224 is an inter tier insulator that isolates one tier of cells 232 from another tier. Insulator 224 can be an oxide-based insulator material, for example. In one embodiment, the circuit includes select gate 226 processed over a layer of insulator 224, and below the tiers of cells 232. Select gate 226 can be used to activate cells 232. Insulator 234 can be a mask insulator or other insulator that allows further processing above cells 232. Each cell 232 as well as select gate 226 can be created with one or more processing operations for each tier or layer that occur prior to state 202.

In one embodiment, pillar 240 is created by a punch etch, which removes the liner of insulator 124 and exposes source 222. Source 222 is a source conductor layer on a semiconductor substrate. In one embodiment, pillar 240 is created with the use of etching and creating a liner along the walls or sides of pillar 240 (the liner is not specifically illustrated). The liner can be removed prior to further processing of the hollow channel pillar.

Figure 2B:
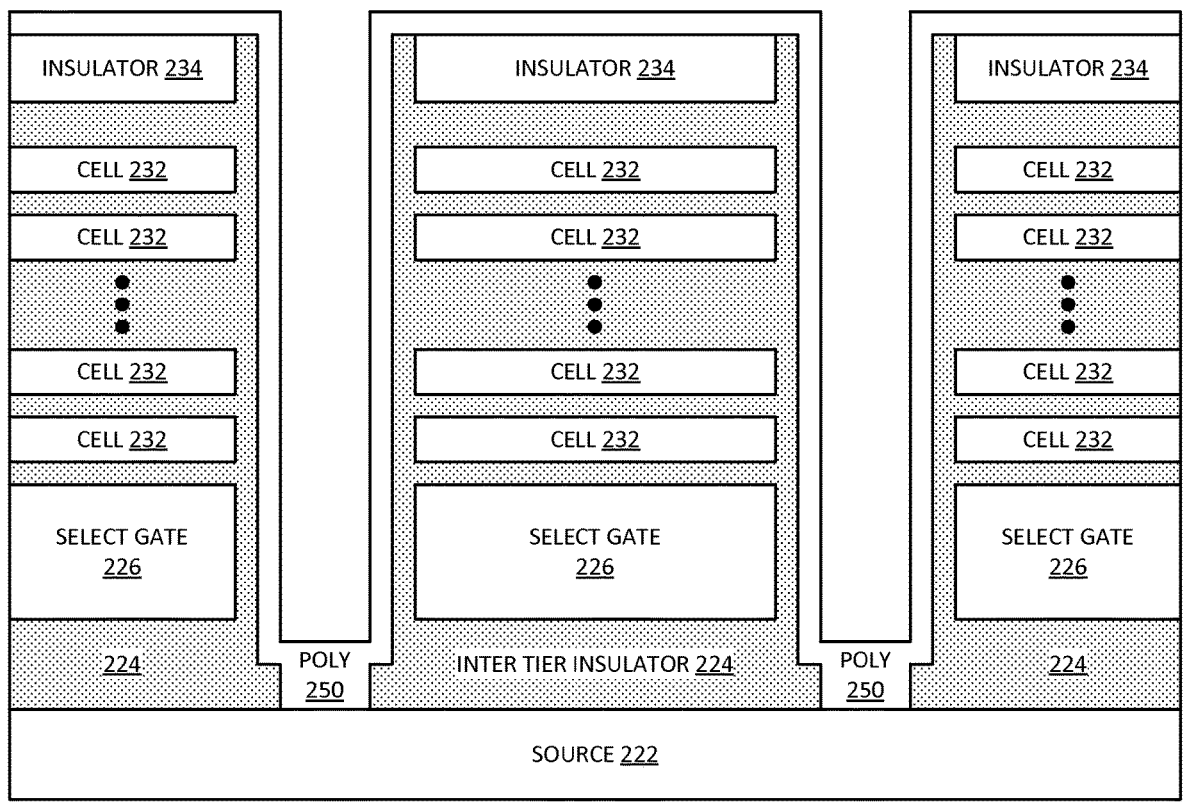

FIG. 2B illustrates circuit state 204, in which the processing creates the hollow channel conductor. In one embodiment, the processing deposits poly 250 over the circuit. In one embodiment, poly 250 is kept thin with a high concentration of in situ doping. Poly 250 is a polycrystalline material, such as polysilicon. Poly-Si tends to result in a lot of grains which cause many defects. The graininess traditionally causes a significant amount of variability in the performance of cells 232. By reducing the thickness of highly doped poly 250, the processing can constrain the grain size as compared to channel length.

It will be understood that limiting the thickness of the poly channel can constrain the grain size, given that it cannot grow past the thickness of the channel. Keeping poly 250 thin can produce smaller grain size, resulting in uniform material and better performance. It will be understood that poly 250 will also be formed on the circuit, as illustrated by the layer of poly over the circuit.

Figure 2C:
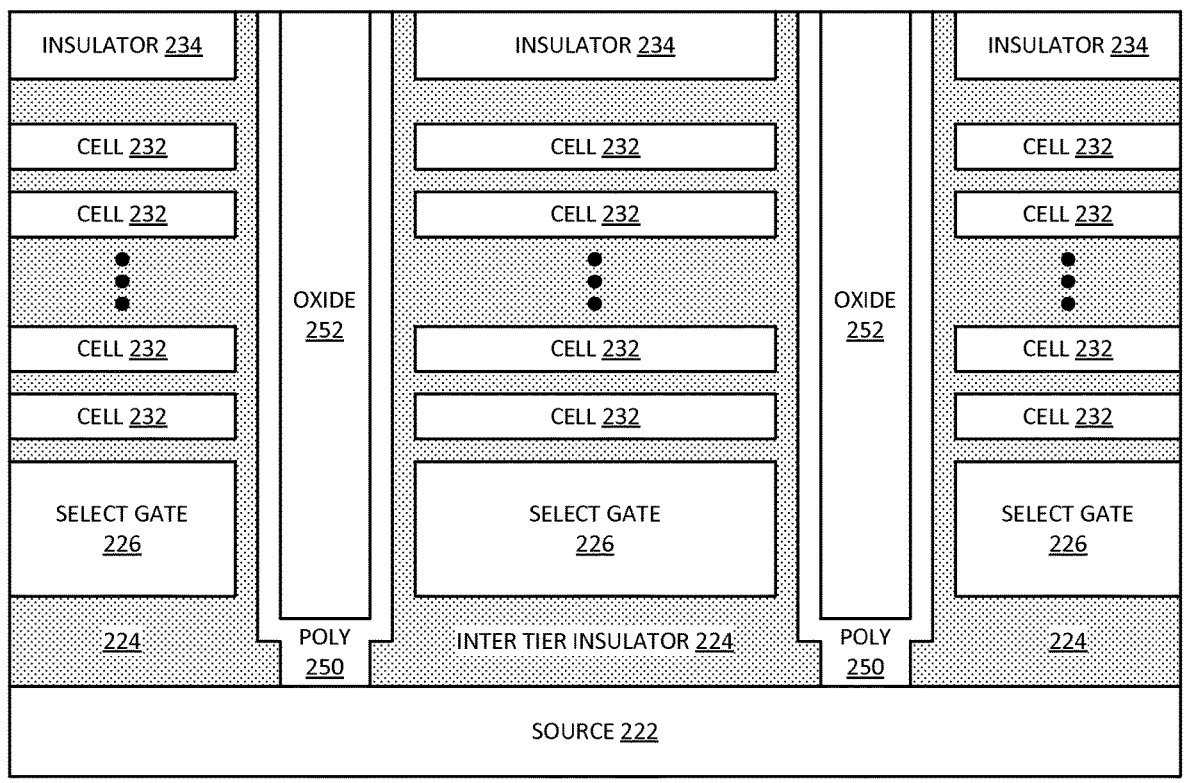

FIG. 2C illustrates circuit state 206, in which the processing fills the hollow channel with an insulator. In one embodiment, the processing grows oxide 252 on poly 250, including within the hollow channel. Oxide 252 can help with the performance characteristics of the hollow channel. It will be understood that in addition to oxide forming within the hollow channel on poly 250, the oxide will form on the poly that is deposited on the circuit. After filling the channel, the processing can include operations to remove the oxide and poly layers, for example, by CMP (chemical-mechanical polishing). Thus, state 206 illustrates a completed channel in pillar 240, with an insulator 234 (e.g., a layer of nitride) over the circuit.

The channel as described herein is referred to as a "hollow channel." In one embodiment, the processing fills the hollow channel with oxide 252 or other insulator. The pillar can still be considered a hollow channel after such processing. The channel itself is the thin layer of conducting material, poly 250. The oxide is not technically part of the channel because it does not conduct. Thus, a pillar having a thin layer of poly conductor on the walls surrounding a layer of oxide is considered a "hollow channel."

The hollow channel can include the heavily doped poly material surrounding the channel insulator, where the channel conductor (poly 250) is adjacent to cells 232. Thus, a signal conducted through poly 250 can induce a charge in cells 232. The hollow channel poly 250 extends through the entire circuit to source 222.

Figure 2D:
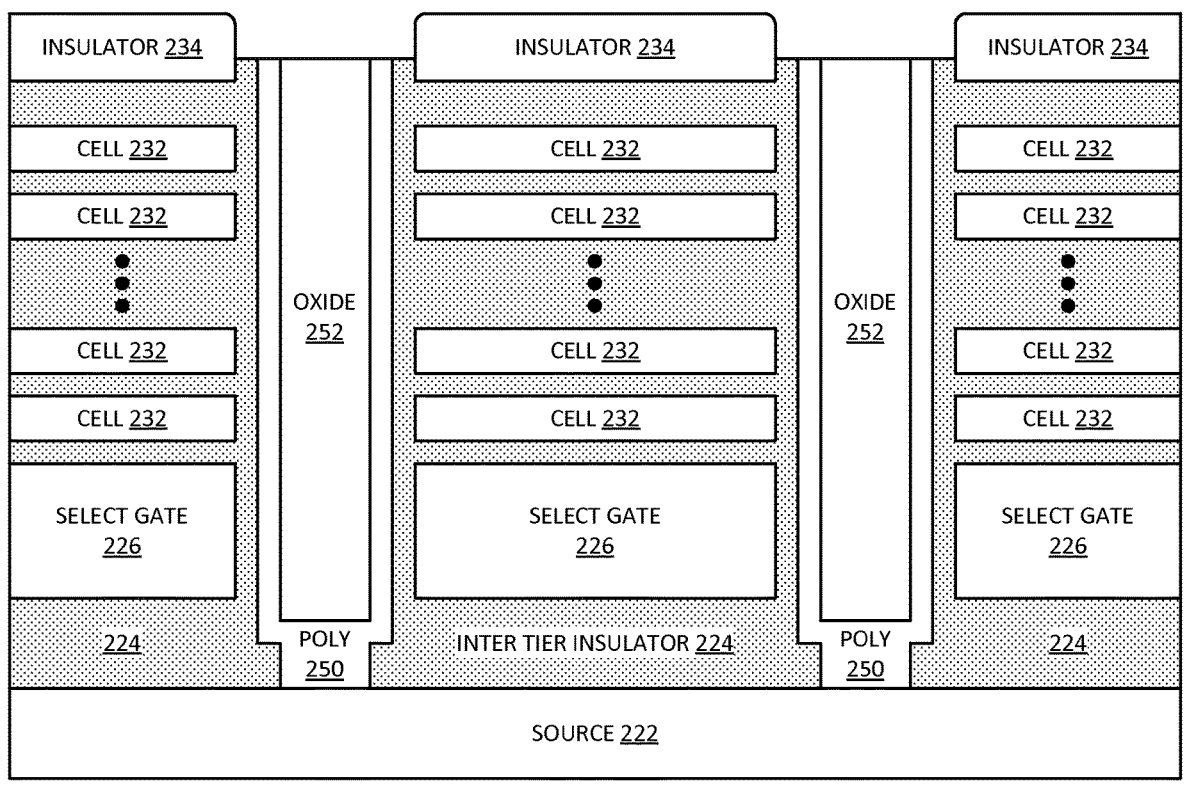

FIG. 2D illustrates circuit state 208, in which the processing prepares the circuit for a stop layer. In one embodiment, the processing causes recessing and rounding the conductive channel. In one embodiment, the processing includes a combination of wet etch and dry etch to recess a portion of the channel and round a corresponding corner (e.g., a top corner) of insulator 234 to allow for filling in the stop layer. In one embodiment, the recessing and rounding is further adjusted with additional processing. For example, the processing can deposit oxy-nitride with a gradient concentration to adjust recess width and the rounding profile. The gradient concentration can result in a reduction of ions (e.g., N+ ions) in insulator 234.

Figure 2E:
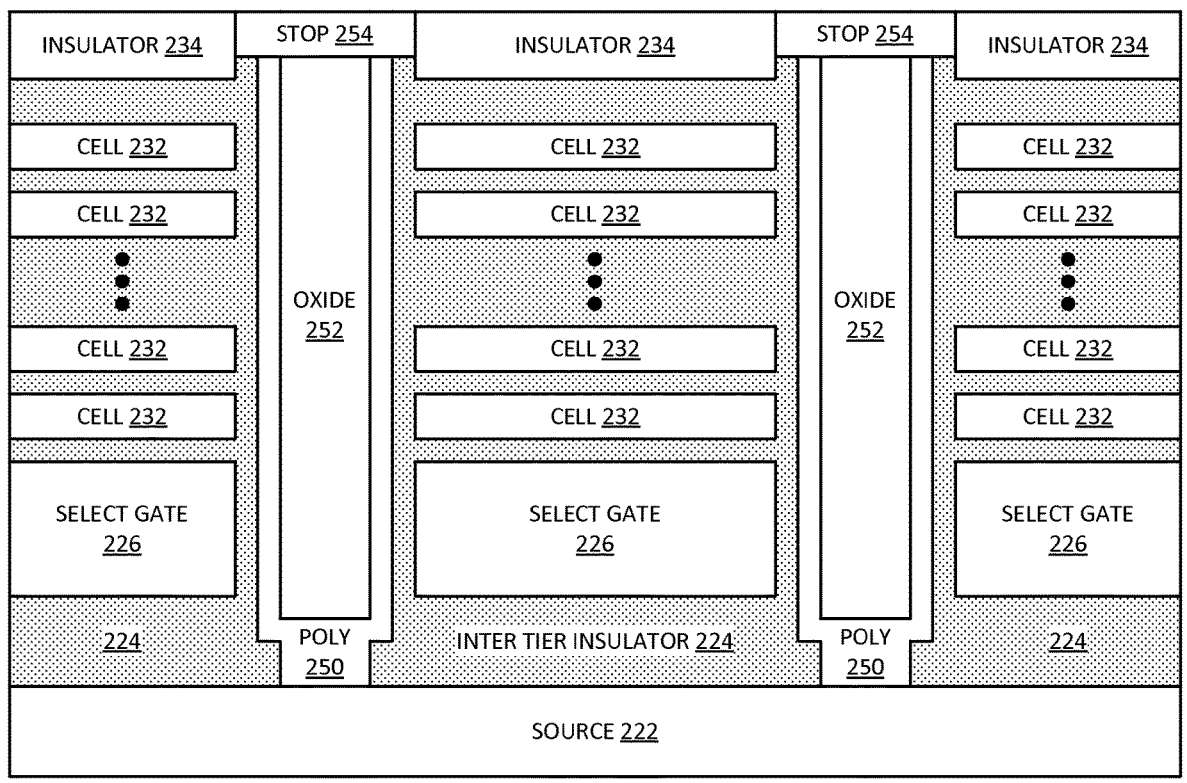

FIG. 2E illustrates circuit state 210, in which the processing creates the stop layer. Stop layer 254 can be a metallic material or other highly conductive material. In one embodiment, stop layer 254 has a chemical property to allow good stopping for a punch etch process. For example, stop layer 254 can be a material that does not react with an etching chemical used to increase the depth of pillar used to make sure the pillar exposes stop layer 254 for another channel to connect to it. Stop layer 254 is created between adjacent decks, and particularly between the hollow channels of two adjacent decks. It will be understood that in one embodiment, each deck can have a number of cells horizontally separated from each other, as well as having vertical stacks of cells. In one embodiment, processing stop layer 254 includes depositing WSix and polishing the circuit (where it will be understood that the polishing will likely remove some of insulator 234).

Figure 2F:
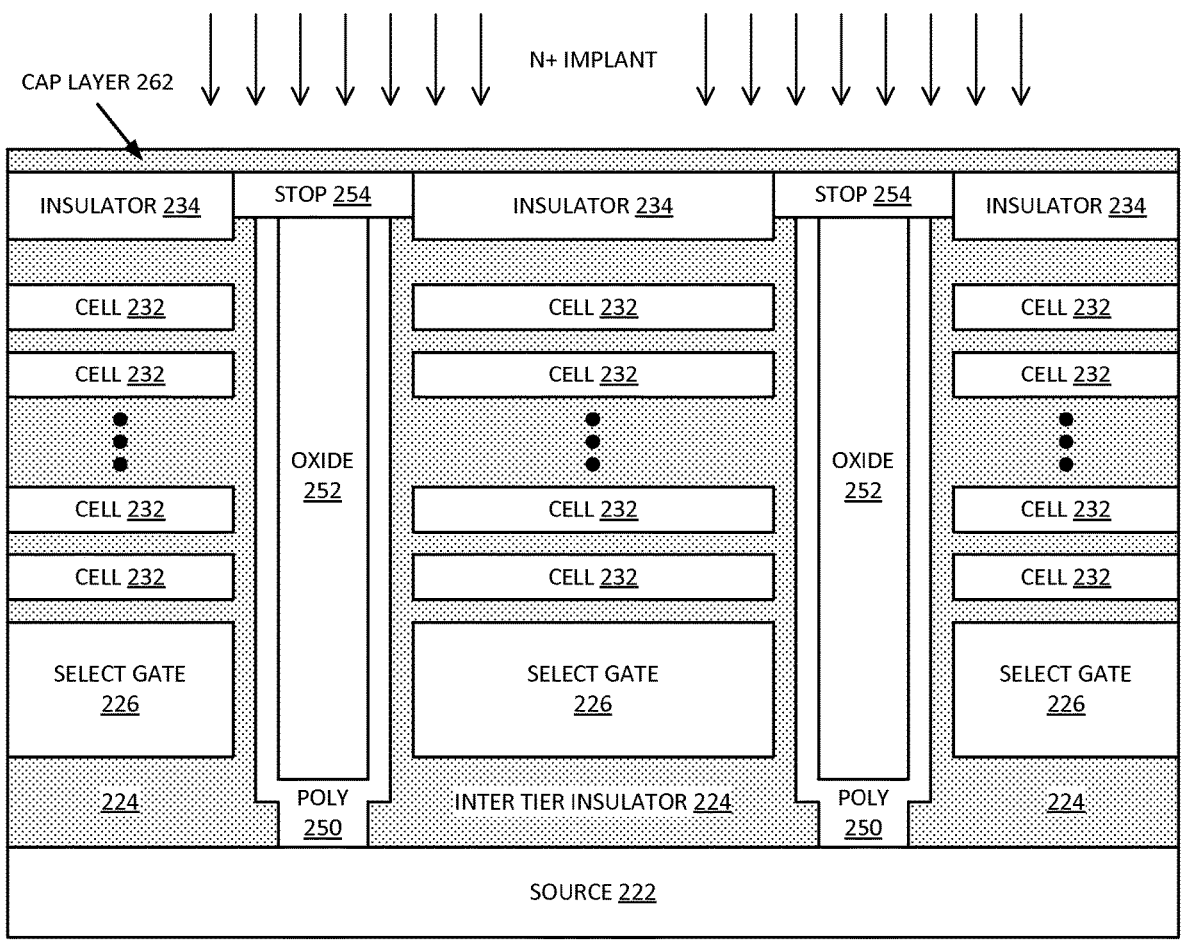

FIG. 2F illustrates circuit state 212, in which the processing performs ion implant into stop layer 254. In one embodiment, stop layer 254 should be implanted with positive ions to form an ohmic contact with the channels to provide electrical continuity. As shown, N+ implant can be used as a dopant into the stop layer. It will be understood that insulator 234 can have a gradient introduced as in FIG. 2E, which could then be reversed with the ion implant. Thus, the amount of gradient generated in state 210 can correspond to a reverse amount of dopant implant expected in state 212. In one embodiment, the metallic nature of stop layer 254 could require a thin oxide layer on the stop layer to avoid exposing the metal to an implant chamber. Thus, cap layer 262 (which can be the same or similar to inter tier insulator 224) is shown covering insulator 234 and stop layer 254 for state 212.

Figure 2G:
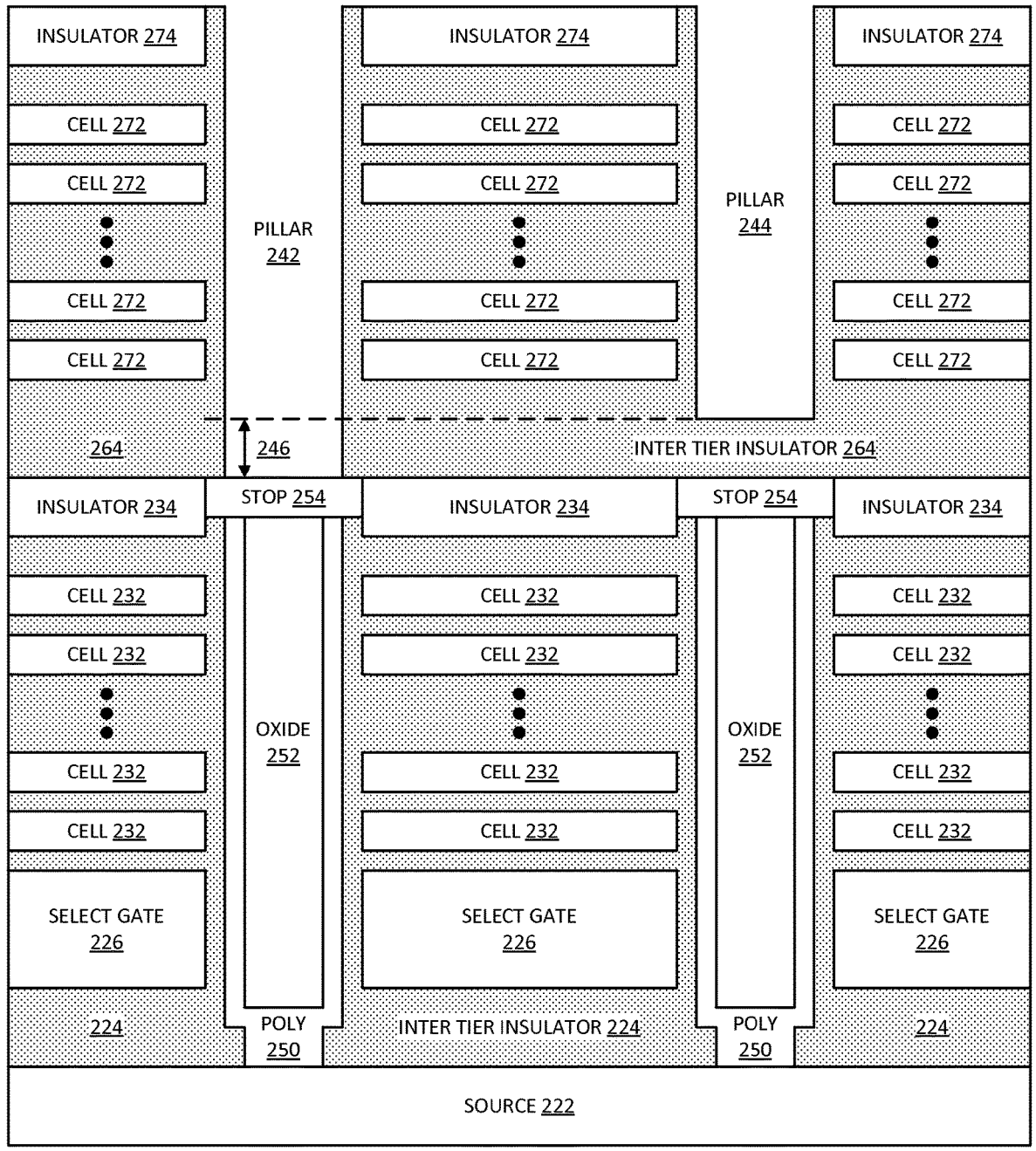

FIG. 2G illustrates circuit state 214, in which another deck is built on the first deck (which can be a bottom most deck in a vertical implementation). The circuit as illustrated in state 212 represents the layer or deck of the circuit closest to source conductor 222. Similar or the same processing operations can be performed to create inter tier insulator 264, tiers of cells 272, insulator 274, and pillars 242 and 244. In one embodiment, insulator 264 between the decks is a buffer oxide, and is significantly thicker than other layers of the insulator. Making a thick buffer oxide insulator can allow for better processing of the pillars.

It will be observed that pillar 242 is illustrated as reaching down to stop layer 254, while pillar 244 stops at a shallower depth, giving difference 246 between pillar depths. The thickness of insulator 264 can be chosen to make sure that all pillars should have some etching into the insulator, even as others might reach all the way to expose the stop layer of the deck below. In one embodiment, the processing performs a two step punch etch to achieve pillars of uniform depth. State 214 can represent a non-selective etch through tiers of cells 272.

Figure 2H:
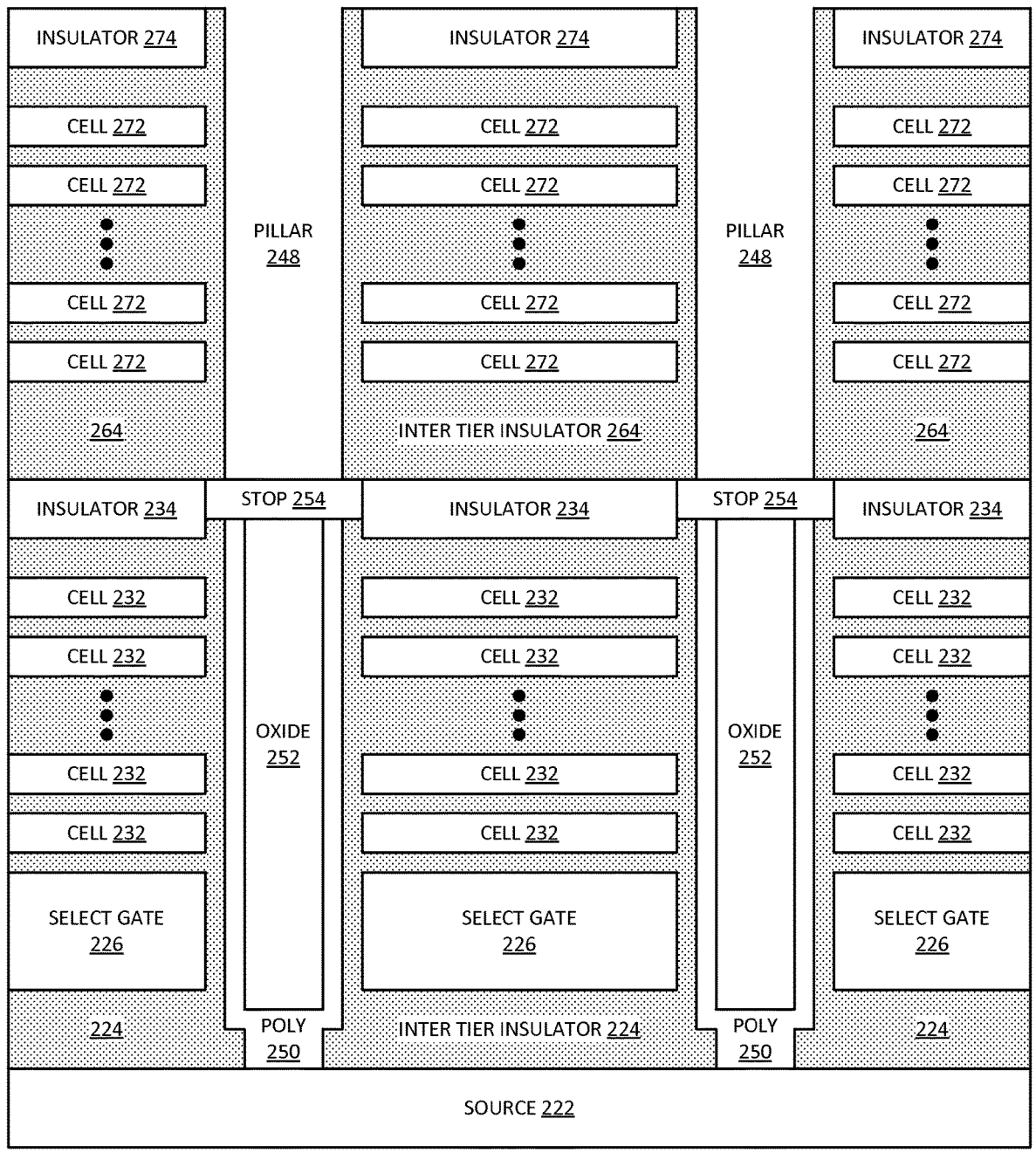
Figure 21:
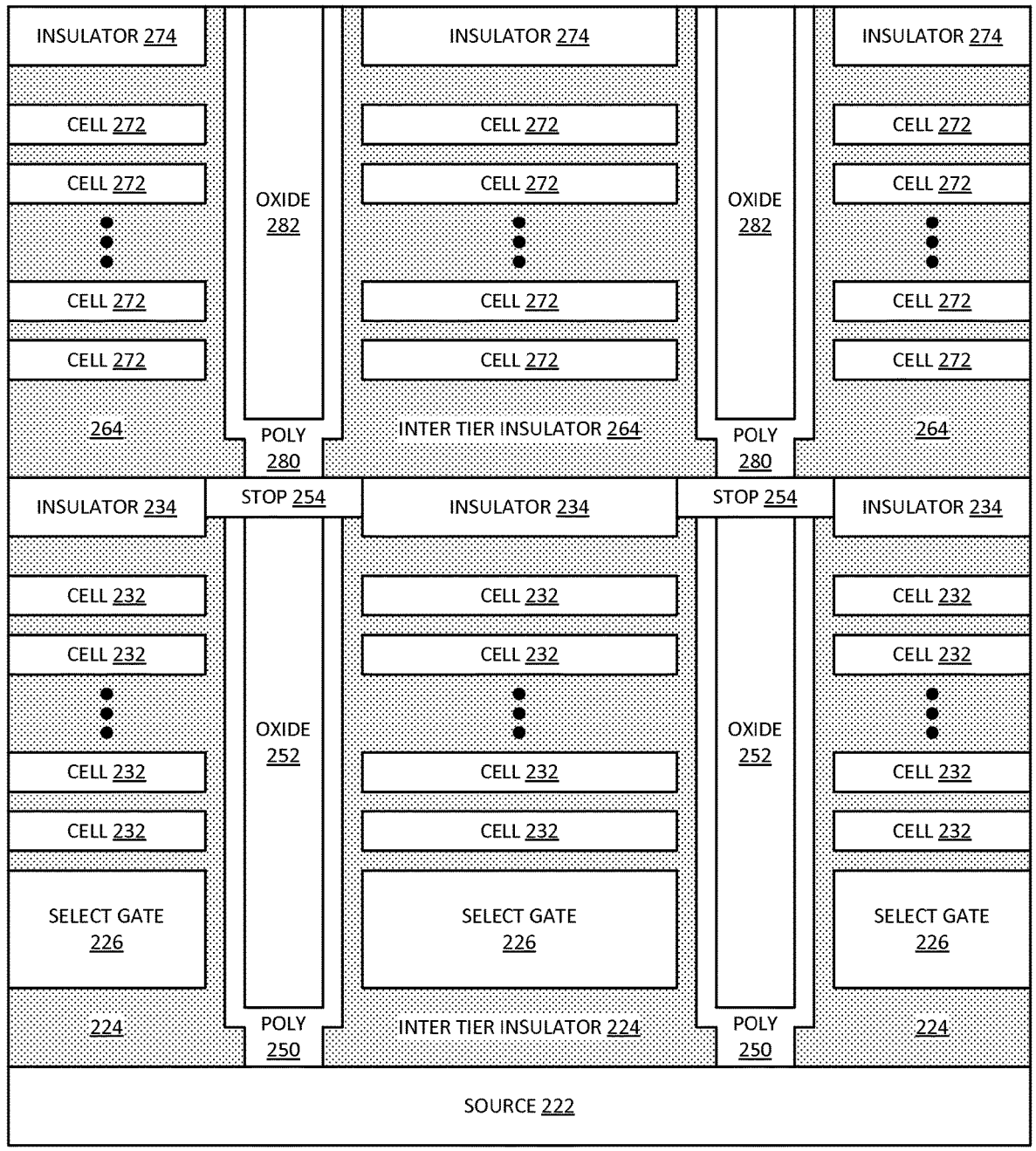

FIG. 2H illustrates circuit state 216, in which the processing provides uniform pillars. State 216 can represent a selective etch (e.g., a highly selective oxide etch) to create uniform pillars 248. In one embodiment, the processing uses an endpoint to detect a signal at stop layer 254, and stops the etching of state 214. The processing can then switch chemistry to stop very cleanly on stop layer 254, and allow pillars that have not yet etched to the stop layer to reach it.

FIG. 2I illustrates circuit state 218, in which the processing creates the hollow channel of the upper deck. It will be understood that while labeled as cells 272 in the second deck, cells 272 are essentially the same as cells 232. They can be formed by the same processing and thus have the same characteristic behavior when finished. They are labeled differently solely for purposes of identifying which components are formed at which deck. The same could be said for insulators 264 and 224, and insulators 274 and 234.

In one embodiment, the processing also forms a hollow channel with poly 280 as the channel conductor and oxide 282 to insulate the hollow channel. The hollow channel of the second deck is effectively the same as the hollow channel of the first deck, but the second hollow channel is directly coupled to stop layer 254 at one end, and the first hollow channel is directly coupled to stop layer 254 at one end and source 222 at the other end. It will be understood that because poly 280 is highly doped, making insulator 264 thick will not have an effect on the ability of the second hollow channel to make electrical connection between source 222 and cells 272.

It will be understood that while two decks are shown, the same techniques could be applied to create more decks on the two decks illustrated. In one embodiment, select gate 226 is a select gate for all tiers of cells (both cells 232 and 272) stacked vertically above the gate. In one embodiment, select gate 226 is considered part of the first deck, but could also be considered to be "below" the first deck. In the case that the select gate is considered to be below the first deck, it will be understood that the first hollow channel would extend through the entire first deck to below the first deck until making electrical contact with the source conductor.

In one embodiment, part of the processing of the circuit includes heating or annealing layers of the device together to form a better contact. For example, the processing can include annealing operations after deposition of poly 280, which can create a lower resistance in the contact between poly 280 and stop layer 254. In traditional methods, the channel conductor would not be highly doped, and annealing the stop layer to the channel would cause a conductive gradient that would cause non-uniform performance in the circuit device. Since poly 280 is highly doped, diffusion from stop layer 254 into the hollow channel does not have a negative effect on device performance.

Figure 3:
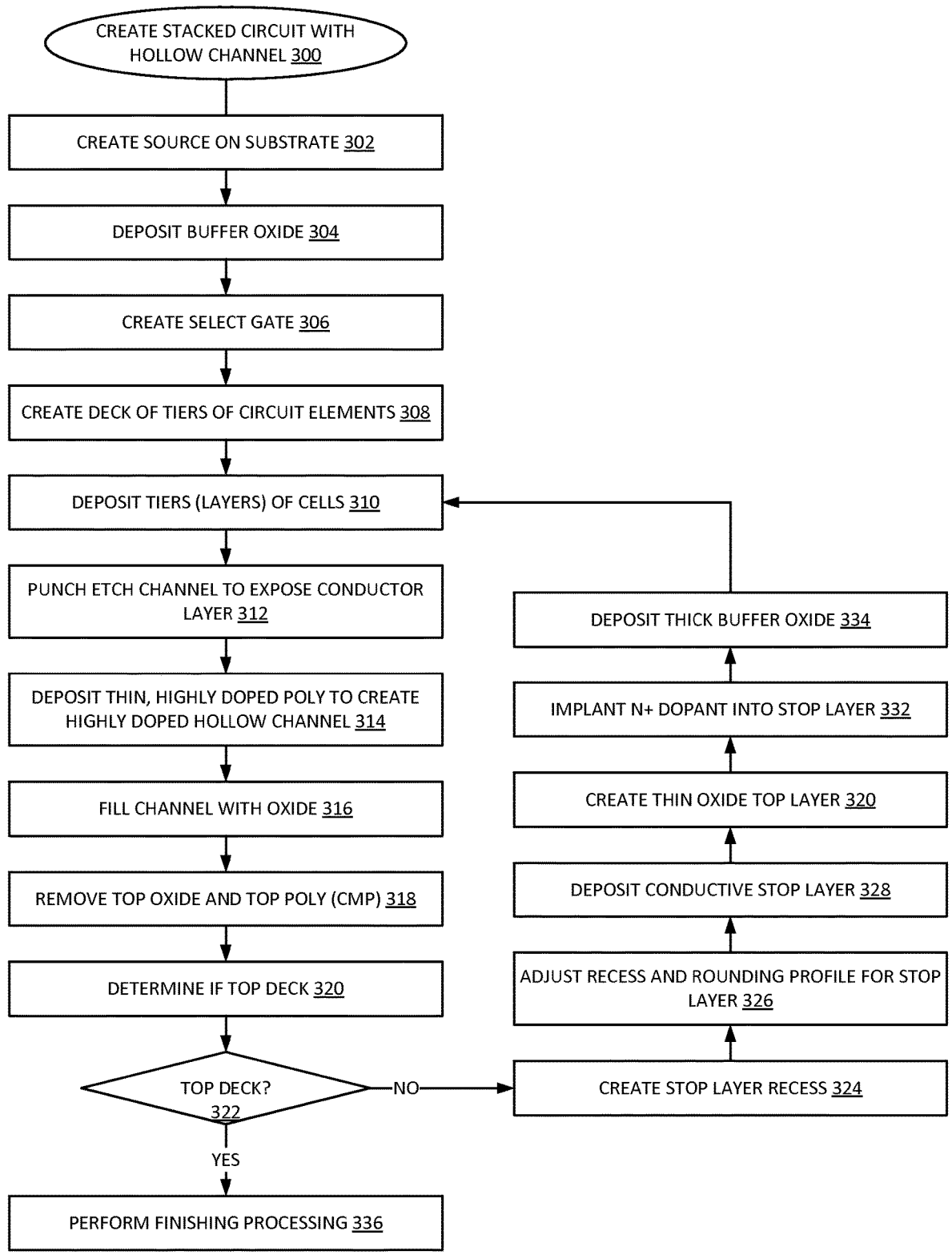
FIG. 3 is a flow diagram of an embodiment of a process for creating a stacked hollow channel circuit.

FIG. 3 is a flow diagram of an embodiment of a process for creating a stacked hollow channel circuit. Process 300 can be one example of a process to produce the circuit and circuit states of FIGS. 2A-2I. Process 300 can be executed by processing equipment of a manufacturing entity. The manufacturer configures the processing equipment and performs a series of processing steps or operations on a semiconductor wafer to create the electronic circuits. The processing equipment can include tools to perform any type of materials processing operations (deposit, CMP, etch, ion implant, annealing, other). Such processing equipment includes computer equipment and mechanical and electrical tools that perform the processing. The processing equipment is controlled by one or more processing operation controls, which can include hardware logic and/or software/firmware logic to control the processing. The equipment can be programmed or configured to perform certain operations in a certain order. Collectively the equipment and processing or configuration can be referred to as a processing system. For purposes of process 300, the operations are described as being performed by "the processing," which refers indirectly to the manufacturer and the processing system used by the manufacturer.

The processing creates a source region on a semiconductor substrate, such as a silicon wafer, 302. The electronic circuit will be manufactured on the source. The source is a conductor that can be activated to create electrical activity in the circuit elements. In one embodiment, the processing deposits a buffer oxide over the source, 304. The buffer oxide is an insulator. The processing creates a select gate for the electronic circuit, 306. In one embodiment, the select gate is the gate for all circuit elements stacked vertically above it.

The processing creates a deck of tiers of circuit elements, 308. In one embodiment, the processing deposits layers or tiers of cells or other circuit elements, 310. The tiers of circuit elements are created vertically stacked on each other, and can be processed in multiple cycles of operations where material can be selectively deposited and removed to create the desired circuit elements, such as memory cells. The tiers of circuit elements can be separated by an oxide material as an inter-tier insulator. The processing can also deposit an insulator, such as a nitride material, on the deck as a hard mask insulator. In one embodiment, the processing performs a punch etch to create a pillar for a channel, the pillar exposing the conductor layer below the deck of cells, 312. For the first deck, the conductor exposed is the source conductor. For other decks, the source conductor can be considered the stop layer of the deck directly below. In one embodiment, the punch etch is performed as a two part etch process, with a first etch to remove some material, and a second etch to stop cleanly on the conductor.

The processing deposits a thin, highly doped polycrystalline material to create a highly doped hollow conducting channel, 314. The poly material can be deposited in the pillar with a thin layer of oxide as a tunnel oxide between the highly doped channel and the circuit elements. In one embodiment, the processing fills the hollow channel with oxide as an insulator, 316. The processing can remove an oxide and poly layer, such as by CMP, 318. In one embodiment, the processing system determines if the deck of cell layers just processed is the last layer, 320. For example, the processing system can be configured to create a certain number of decks, and the processing system tracks how many decks have been created. In one embodiment, the processing system allows input to control whether or not to perform additional processing on the same wafer(s) to create an additional deck. If the deck just finished is the top deck,

322 YES branch, the processing finishes the electronic devices with finishing processing, 336.

If the deck just processed is not the last deck, 322 NO branch, the processing creates another deck on the deck just processed. The decks are interconnected by a conductive stop layer. In one embodiment, the processing creates a stop layer recess, such as by etching or processing out the portion of the hollow channel created in the previously finished deck, 324. In one embodiment, the processing adjusts the recess depth and/or width and/or rounding profile for the stop layer, 326. Such adjustments can refine the recess to prepare for processing to be used to create the stop layer and obtain a desired stop layer profile.

The processing can deposit a conductive stop layer into the recess, 328. The material deposited could be provided with a better performance profile by implanting the stop layer material with N+ dopant ions. Thus, in one embodiment, the processing creates a thin oxide layer to prevent exposing the stop layer material directed to an implant chamber, 330, and the implants N+ dopant ions into the stop layer 332. Such implanting will also naturally implant into the insulator (e.g., an insulator covering the deck), and thus the processing could additionally create a gradient profile in the insulator to compensate for the ion implant. The ion implant may create a gradient in the stop layer as well, which can be normalized through the stop layer during an anneal operation. In one embodiment, the processing deposits a thick buffer oxide on the insulator and the stop layer to prepare for the tiers of cells or circuit elements, 334. The thick buffer oxide can be deposited as an etch buffer insulator. The processing can then continue by depositing tiers of cell, 308, and performing similar processing to create the other deck.

Figure 4:
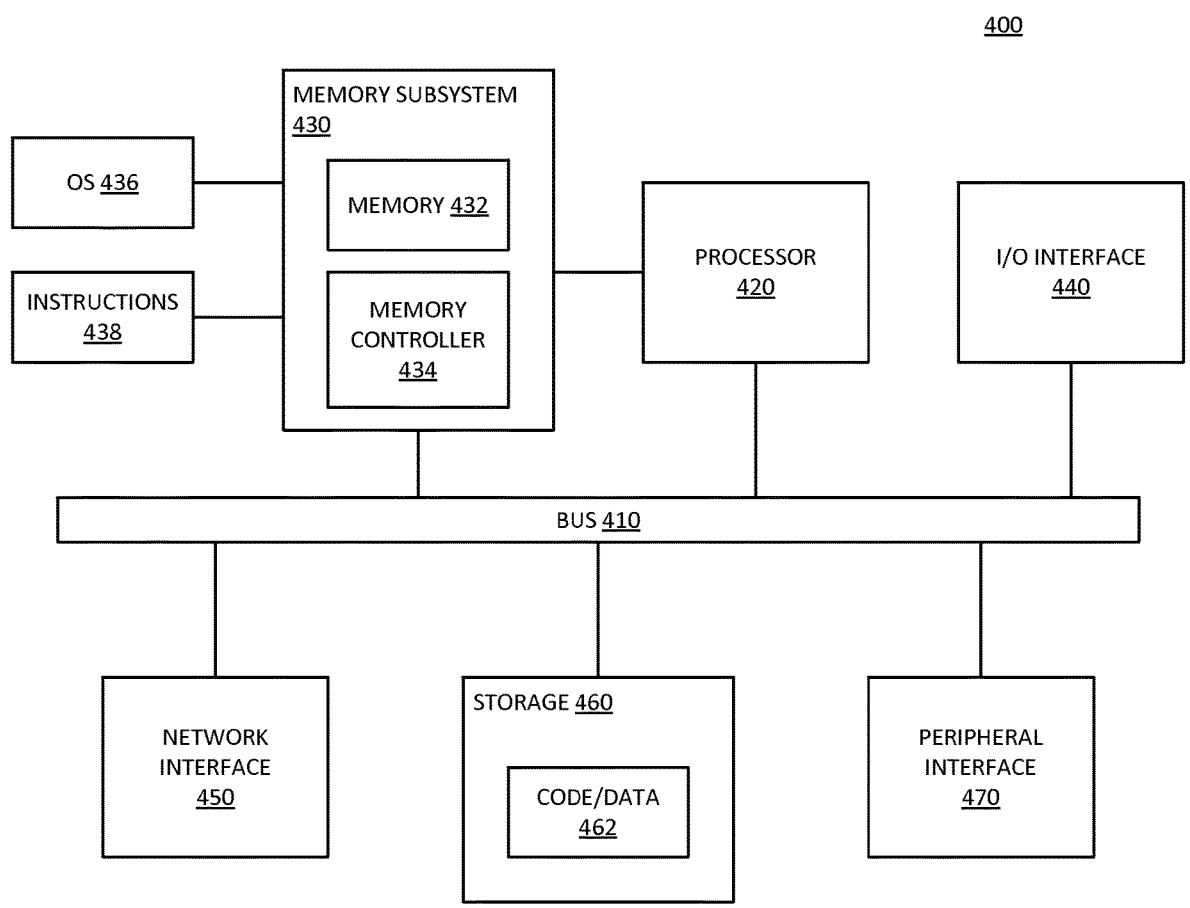
FIG. 4 is a block diagram of an embodiment of a computing system in which stacked hollow channel circuits can be implemented.

FIG. 4 is a block diagram of an embodiment of a computing system in which stacked hollow channel circuits can be implemented. System 400 represents a computing device in accordance with any embodiment described herein, and can be a laptop computer, a desktop computer, a server, a gaming or entertainment control system, a scanner, copier, printer, routing or switching device, or other electronic device. System 400 includes processor 420, which provides processing, operation management, and execution of instructions for system 400. Processor 420 can include any type of microprocessor, central processing unit (CPU), processing core, or other processing hardware to provide processing for system 400. Processor 420 controls the overall operation of system 400, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 430 represents the main memory of system 400, and provides temporary storage for code to be executed by processor 420, or data values to be used in executing a routine. Memory subsystem 430 can include one or more memory devices such as read-only memory (ROM), flash memory, one or more varieties of random access memory (RAM), or other memory devices, or a combination of such devices. Memory subsystem 430 stores and hosts, among other things, operating system (OS) 436 to provide a software platform for execution of instructions in system 400. Additionally, other instructions 438 are stored and executed from memory subsystem 430 to provide the logic and the processing of system 400. OS 436 and instructions 438 are executed by processor 420. Memory subsystem 430 includes memory device 432 where it stores data, instructions, programs, or other items. In one embodiment, memory subsystem includes memory controller 434, which is a memory controller to generate and issue commands to memory device 432. It will be understood that memory controller 434 could be a physical part of processor 420.

Processor 420 and memory subsystem 430 are coupled to bus/bus system 410. Bus 410 is an abstraction that represents any one or more separate physical buses, communication lines/interfaces, and/or point-to-point connections, connected by appropriate bridges, adapters, and/or controllers. Therefore, bus 410 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 410 can also correspond to interfaces in network interface 450.

System 400 also includes one or more input/output (I/O) interface(s) 440, network interface 450, one or more internal mass storage device(s) 460, and peripheral interface 470 coupled to bus 410. I/O interface 440 can include one or more interface components through which a user interacts with system 400 (e.g., video, audio, and/or alphanumeric interfacing). Network interface 450 provides system 400 the ability to communicate with remote devices (e.g., servers, other computing devices) over one or more networks. Network interface 450 can include an Ethernet adapter, wireless interconnection components, USB (universal serial bus), or other wired or wireless standards-based or proprietary interfaces.

Storage 460 can be or include any conventional medium for storing large amounts of data in a nonvolatile manner, such as one or more magnetic, solid state, or optical based disks, or a combination. Storage 460 holds code or instructions and data 462 in a persistent state (i.e., the value is retained despite interruption of power to system 400). Storage 460 can be generically considered to be a "memory," although memory 430 is the executing or operating memory to provide instructions to processor 420. Whereas storage 460 is nonvolatile, memory 430 can include volatile memory (i.e., the value or state of the data is indeterminate if power is interrupted to system 400).

Peripheral interface 470 can include any hardware interface not specifically mentioned above. Peripherals refer generally to devices that connect dependently to system 400. A dependent connection is one where system 400 provides the software and/or hardware platform on which operation executes, and with which a user interacts.

In one embodiment, memory subsystem 430 (e.g., memory devices 432) and/or other components of system 400 include elements that are created as stacked hollow channel circuits. By creating the circuit elements in vertical tiers, the hardware components of system 400 can be implemented on less real estate than what has traditionally been possible. To be able to create the vertical tiers, the components can be created with multiple decks of circuit elements. The decks are interconnected by highly doped hollow channels coupled by conductive stop layers. The stacked circuit devices can be created with two or more decks.

Figure 5:
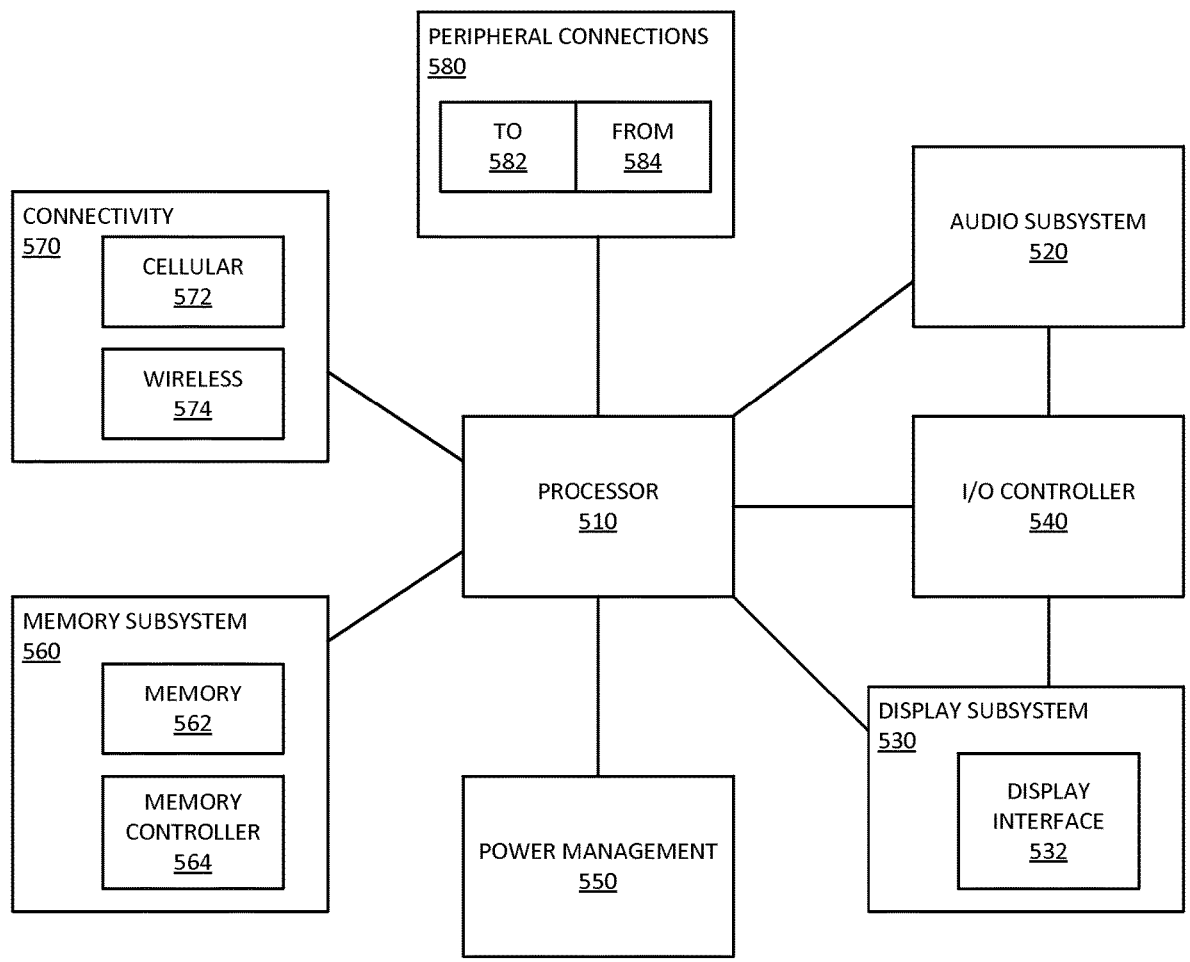
FIG. 5 is a block diagram of an embodiment of a mobile device in which stacked hollow channel circuits can be implemented.

FIG. 5 is a block diagram of an embodiment of a mobile device in which stacked hollow channel circuits can be implemented. Device 500 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 500.

Device 500 includes processor 510, which performs the primary processing operations of device 500. Processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting device 500 to another device. The processing operations can also include operations related to audio I/O and/or display I/O.

In one embodiment, device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 500, or connected to device 500. In one embodiment, a user interacts with device 500 by providing audio commands that are received and processed by processor 510.

Display subsystem 530 represents hardware (e.g., display devices) and software (e.g., drivers) components that provide a visual and/or tactile display for a user to interact with the computing device. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touchscreen device that provides both output and input to a user.

I/O controller 540 represents hardware devices and software components related to interaction with a user. I/O controller 540 can operate to manage hardware that is part of audio subsystem 520 and/or display subsystem 530. Additionally, I/O controller 540 illustrates a connection point for additional devices that connect to device 500 through which a user might interact with the system. For example, devices that can be attached to device 500 might include microphone devices, speaker or stereo systems, video systems or other display device, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of device 500. Additionally, audio output can be provided instead of or in addition to display output. In another example, if display subsystem includes a touchscreen, the display device also acts as an input device, which can be at least partially managed by I/O controller 540. There can also be additional buttons or switches on device 500 to provide I/O functions managed by I/O controller 540.

In one embodiment, I/O controller 540 manages devices such as accelerometers, cameras, light sensors or other environmental sensors, gyroscopes, global positioning system (GPS), or other hardware that can be included in device 500. The input can be part of direct user interaction, as well as providing environmental input to the system to influence its operations (such as filtering for noise, adjusting displays for brightness detection, applying a flash for a camera, or other features). In one embodiment, device 500 includes power management 550 that manages battery power usage, charging of the battery, and features related to power saving operation.

Memory subsystem 560 includes memory device(s) 562 for storing information in device 500. Memory subsystem 560 can include nonvolatile (state does not change if power to the memory device is interrupted) and/or volatile (state is indeterminate if power to the memory device is interrupted) memory devices. Memory 560 can store application data, user data, music, photos, documents, or other data, as well as system data (whether long-term or temporary) related to the execution of the applications and functions of system 500. In one embodiment, memory subsystem 560 includes memory controller 564 (which could also be considered part of the control of system 500, and could potentially be considered part of processor 510). Memory controller 564 includes a scheduler to generate and issue commands to memory device 562.

Connectivity 570 includes hardware devices (e.g., wireless and/or wired connectors and communication hardware) and software components (e.g., drivers, protocol stacks) to enable device 500 to communicate with external devices. The external device could be separate devices, such as other computing devices, wireless access points or base stations, as well as peripherals such as headsets, printers, or other devices.

Connectivity 570 can include multiple different types of connectivity. To generalize, device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 574 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 580 include hardware interfaces and connectors, as well as software components (e.g., drivers, protocol stacks) to make peripheral connections. It will be understood that device 500 could both be a peripheral device ("to" 582) to other computing devices, as well as have peripheral devices ("from" 584) connected to it. Device 500 commonly has a "docking" connector to connect to other computing devices for purposes such as managing (e.g., downloading and/or uploading, changing, synchronizing) content on device 500. Additionally, a docking connector can allow device 500 to connect to certain peripherals that allow device 500 to control content output, for example, to audiovisual or other systems.

In addition to a proprietary docking connector or other proprietary connection hardware, device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 560 (such as memory devices 562) and/or other components of system 500 include elements that are created as stacked hollow channel circuits. By creating the circuit elements in vertical tiers, the hardware components of system 400 can be implemented on less real estate than what has traditionally been possible. To be able to create the vertical tiers, the components can be created with multiple decks of circuit elements. The decks are interconnected by highly doped hollow channels coupled by conductive stop layers. The stacked circuit devices can be created with two or more decks.

In one aspect, a circuit device includes: a source conductor layer on a semiconductor substrate; multiple decks of memory cells, the decks being stacked on each other, each deck including multiple tiers of memory cells stacked on each other, each tier including a memory cell; and at least one hollow channel extending through the deck, the hollow channel including a channel insulator, and a heavily doped polycrystalline material surrounding the channel insulator and positioned adjacent to the multiple tiers of memory cells; and a conductive stop layer between each pair of adjacent decks, wherein the stop layer interconnects a hollow channel of one deck to the hollow channel of the other deck; wherein the hollow channel of a first deck extends from the source conductor to the stop layer between the first deck and an adjacent deck, and the hollow channel of each other deck extends from the stop layer through the deck.

In one embodiment, the multiple decks comprises more than two decks of memory cells. In one embodiment, each deck includes more than 30 tiers of memory cells. In one embodiment, the heavily doped polycrystalline material comprises heavily doped polysilicon. In one embodiment, the heavily doped polycrystalline material comprises a thin channel of polycrystalline material having a thickness of approximately one fifth or less than a width of the hollow channel. In one embodiment, the conductive stop layer comprises a highly conductive material. In one embodiment, the highly conductive material comprises a metal alloy. In one embodiment, the circuit device further includes a select gate in the first deck, wherein the select gate is the select gate for all memory cells of the multiple decks.

In one aspect, an electronic device includes: a three-dimensional stacked memory device to store data, the memory device including: a source conductor layer on a semiconductor substrate; multiple decks of memory cells, the decks being stacked on each other, each deck including multiple tiers of memory cells stacked on each other, each tier including a memory cell; and at least one hollow channel extending through the deck, the hollow channel including a channel insulator, and a heavily doped polycrystalline material surrounding the channel insulator and positioned adjacent to the multiple tiers of memory cells; and a conductive stop layer between each pair of adjacent decks, wherein the stop layer interconnects a hollow channel of one deck to the hollow channel of the other deck; wherein the hollow channel of a first deck extends from the source conductor to the stop layer between the first deck and an adjacent deck, and the hollow channel of each other deck extends from the stop layer through the deck; and a touchscreen display coupled to generate a display based on data accessed from the memory device.

In one embodiment, the multiple decks comprises more than two decks of memory cells. In one embodiment, the heavily doped polycrystalline material comprises heavily doped polysilicon. In one embodiment, the heavily doped polycrystalline material comprises a thin channel of polycrystalline material having a thickness of approximately one fifth or less than a width of the hollow channel. In one embodiment, the conductive stop layer comprises a highly conductive material. In one embodiment, the highly conductive material comprises a metal alloy. In one embodiment, the electronic device further includes a select gate in the first deck, wherein the select gate is the select gate for all memory cells of the multiple decks.

In one aspect, a method includes: generating a first deck of circuit elements, the first deck having multiple tiers of circuit elements stacked above a source conductor; creating a first highly doped hollow channel in the first deck to electrically couple to the source conductor; creating a conductive stop layer in the first hollow channel of the first deck, the stop layer to electrically couple to the source conductor via the first hollow channel; generating a second deck of circuit elements, the second deck having multiple tiers of circuit elements stacked above the source conductor; and creating a second highly doped hollow channel in the second deck to electrically couple to the stop layer.

In one embodiment, creating the first hollow channel further comprises: creating a hollow pillar through the first deck to the source conductor; and depositing a highly doped polycrystalline material along sides of the hollow pillar. In one embodiment, creating the first hollow channel further comprises: depositing a highly doped polycrystalline material along sides of the hollow pillar, a thickness of the polycrystalline materials being much less than a width of the hollow pillar; and filling the hollow pillar with an insulator. In one embodiment, creating the hollow pillar further comprises: etching the hollow pillar with a non-selective etch material to create an initial depth of the hollow pillar; and etching the hollow pillar with a selective etch material to create a clean stop of the hollow pillar at the source conductor. In one embodiment, creating the conductive stop layer further comprises: depositing a metal alloy. In one embodiment, creating the conductive stop layer further comprises: annealing the stop layer to the first hollow channel. In one embodiment, the conductive stop layer comprises a first conductive stop layer, the method further comprising: creating a second conductive stop layer in the second hollow channel of the second deck, the second stop layer to electrically couple to the first stop layer via the second hollow channel; generating a third deck of circuit elements, the third deck having multiple tiers of circuit elements stacked above the source conductor; and creating a third highly doped hollow channel in the third deck to electrically couple to the second stop layer. In one embodiment, the method further comprising: creating a select gate between the source conductor and the multiple tiers of the first deck, wherein the select gate is the select gate for all memory cells of the multiple decks.

In one aspect, an article of manufacture comprising a computer readable storage medium having content stored thereon, which when executed performs operations including: generating a first deck of circuit elements, the first deck having multiple tiers of circuit elements stacked above a source conductor; creating a first highly doped hollow channel in the first deck to electrically couple to the source conductor; creating a conductive stop layer in the first hollow channel of the first deck, the stop layer to electrically couple to the source conductor via the first hollow channel; generating a second deck of circuit elements, the second deck having multiple tiers of circuit elements stacked above the source conductor; and creating a second highly doped hollow channel in the second deck to electrically couple to the stop layer.

In one embodiment, the content for creating the first hollow channel further comprises content for creating a hollow pillar through the first deck to the source conductor; and depositing a highly doped polycrystalline material along sides of the hollow pillar. In one embodiment, the content for creating the first hollow channel further comprises content for depositing a highly doped polycrystalline material along sides of the hollow pillar, a thickness of the polycrystalline materials being much less than a width of the hollow pillar; and filling the hollow pillar with an insulator. In one embodiment, the content for creating the hollow pillar further comprises content for etching the hollow pillar with a non-selective etch material to create an initial depth of the hollow pillar; and etching the hollow pillar with a selective etch material to create a clean stop of the hollow pillar at the source conductor. In one embodiment, the content for creating the conductive stop layer further comprises content for depositing a metal alloy. In one embodiment, the content for creating the conductive stop layer further comprises content for annealing the stop layer to the first hollow channel. In one embodiment, the conductive stop layer comprises a first conductive stop layer, and further comprising content for creating a second conductive stop layer in the second hollow channel of the second deck, the second stop layer to electrically couple to the first stop layer via the second hollow channel; generating a third deck of circuit elements, the third deck having multiple tiers of circuit elements stacked above the source conductor; and creating a third highly doped hollow channel in the third deck to electrically couple to the second stop layer. In one embodiment, the article of manufacture further comprising content for creating a select gate between the source conductor and the multiple tiers of the first deck, wherein the select gate is the select gate for all memory cells of the multiple decks.

In one aspect, an apparatus includes: means for generating a first deck of circuit elements, the first deck having multiple tiers of circuit elements stacked above a source conductor; means for creating a first highly doped hollow channel in the first deck to electrically couple to the source conductor; means for creating a conductive stop layer in the first hollow channel of the first deck, the stop layer to electrically couple to the source conductor via the first hollow channel; means for generating a second deck of circuit elements, the second deck having multiple tiers of circuit elements stacked above the source conductor; and means for creating a second highly doped hollow channel in the second deck to electrically couple to the stop layer.

In one embodiment, the means for creating the first hollow channel further comprises means for creating a hollow pillar through the first deck to the source conductor; and depositing a highly doped polycrystalline material along sides of the hollow pillar. In one embodiment, the means for creating the first hollow channel further comprises means for depositing a highly doped polycrystalline material along sides of the hollow pillar, a thickness of the polycrystalline materials being much less than a width of the hollow pillar; and filling the hollow pillar with an insulator. In one embodiment, the means for creating the hollow pillar further comprises means for etching the hollow pillar with a non-selective etch material to create an initial depth of the hollow pillar; and etching the hollow pillar with a selective etch material to create a clean stop of the hollow pillar at the source conductor. In one embodiment, the means for creating the conductive stop layer further comprises means for depositing a metal alloy. In one embodiment, the means for creating the conductive stop layer further comprises means for annealing the stop layer to the first hollow channel. In one embodiment, the conductive stop layer comprises a first conductive stop layer, and further comprising means for creating a second conductive stop layer in the second hollow channel of the second deck, the second stop layer to electrically couple to the first stop layer via the second hollow channel; generating a third deck of circuit elements, the third deck having multiple tiers of circuit elements stacked above the source conductor; and creating a third highly doped hollow channel in the third deck to electrically couple to the second stop layer. In one embodiment, the apparatus further comprising means for creating a select gate between the source conductor and the multiple tiers of the first deck, wherein the select gate is the select gate for all memory cells of the multiple decks.

In one aspect, a circuit device includes: a source conductor layer on a semiconductor substrate; multiple decks of memory cells, the decks being vertically stacked on top of each other, each deck including multiple tiers of memory cells stacked vertically on top of each other, each tier including a memory cell; and at least one hollow channel extending vertically through the deck, the hollow channel including a channel insulator, and a heavily doped polycrystalline material surrounding the channel insulator and positioned adjacent to the multiple tiers of memory cells; and a conductive stop layer between each pair of vertically adjacent decks, wherein the stop layer interconnects a hollow channel of one deck to the hollow channel of the other deck; wherein the hollow channel of a bottom-most deck extends from the source conductor to the stop layer between the bottom-most deck and a vertically adjacent deck, and the hollow channel of each other deck extends from the stop layer to a top of the deck.

In one embodiment, the multiple decks comprises more than two decks of memory cells. In one embodiment, each deck includes more than 30 tiers of memory cells. In one embodiment, the heavily doped polycrystalline material comprises heavily doped polysilicon. In one embodiment, the heavily doped polycrystalline material comprises a thin channel of polycrystalline material having a thickness of approximately one fifth or less than a width of the hollow channel. In one embodiment, the conductive stop layer comprises a highly conductive material. In one embodiment, the highly conductive material comprises a metal alloy. In one embodiment, the circuit device further comprising a select gate in the bottom-most deck, wherein the select gate is the select gate for all memory cells of the multiple decks.

In one aspect, an electronic device includes: a three-dimensional stacked memory device to store data, the memory device including: a source conductor layer on a semiconductor substrate; multiple decks of memory cells, the decks being vertically stacked on top of each other, each deck including multiple tiers of memory cells stacked vertically on top of each other, each tier including a memory cell; and at least one hollow channel extending vertically through the deck, the hollow channel including a channel insulator, and a heavily doped polycrystalline material surrounding the channel insulator and positioned adjacent to the multiple tiers of memory cells; and a conductive stop layer between each pair of vertically adjacent decks, wherein the stop layer interconnects a hollow channel of one deck to the hollow channel of the other deck; wherein the hollow channel of a bottom-most deck extends from the source conductor to the stop layer between the bottom-most deck and a vertically adjacent deck, and the hollow channel of each other deck extends from the stop layer to a top of the deck; and a touchscreen display coupled to generate a display based on data accessed from the memory device.

In one embodiment, the multiple decks comprises more than two decks of memory cells. In one embodiment, the heavily doped polycrystalline material comprises heavily doped polysilicon. In one embodiment, the heavily doped polycrystalline material comprises a thin channel of polycrystalline material having a thickness of approximately one fifth or less than a width of the hollow channel. In one embodiment, the conductive stop layer comprises a highly conductive material. In one embodiment, the highly conductive material comprises a metal alloy. In one embodiment, the electronic device further comprising a select gate in the bottom-most deck, wherein the select gate is the select gate for all memory cells of the multiple decks.

In one aspect, a method includes: generating a first deck of circuit elements, the first deck having multiple tiers of circuit elements vertically stacked above a source conductor; creating a first highly doped hollow channel in the first deck to electrically couple to the source conductor; creating a conductive stop layer at a top of the first hollow channel of the first deck, the stop layer to electrically couple to the source conductor via the first hollow channel; generating a second deck of circuit elements, the second deck having multiple tiers of circuit elements vertically stacked above the source conductor; and creating a second highly doped hollow channel in the second deck to electrically couple to the stop layer.

In one embodiment, creating the first hollow channel further comprises: creating a hollow pillar from a top of the first deck to the source conductor; depositing a highly doped polycrystalline material along sides of the hollow pillar, a thickness of the polycrystalline materials being much less than a width of the hollow pillar; and filling the hollow pillar with an insulator. In one embodiment, creating the hollow pillar further comprises: etching the hollow pillar with a non-selective etch material to create an initial depth of the hollow pillar; and etching the hollow pillar with a selective etch material to create a clean stop of the hollow pillar at the source conductor. In one embodiment, creating the conductive stop layer further comprises: annealing the stop layer to the first hollow channel. In one embodiment, the conductive stop layer comprises a first conductive stop layer, and further comprising: creating a second conductive stop layer at a top of the second hollow channel of the second deck, the second stop layer to electrically couple to the first stop layer via the second hollow channel; generating a third deck of circuit elements, the third deck having multiple tiers of circuit elements vertically stacked above the source conductor; and creating a third highly doped hollow channel in the third deck to electrically couple to the second stop layer.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit device comprising:
   multiple decks of memory cells, the decks being stacked on each other, wherein a deck includes:
   multiple tiers of memory cells stacked on each other; and
   at least one channel extending through the deck, the channel including a channel insulator, and a doped polycrystalline material surrounding the channel insulator at an end of the channel and positioned between the multiple tiers of memory cells and the channel insulator;
   a conductive stop layer between a channel of a given deck and a channel of an adjacent deck, wherein the conductive stop layer is located over and completely covers the doped polycrystalline material and channel insulator of the channel of the given deck, and wherein the conductive stop layer is located under the doped polycrystalline material surrounding the channel insulator at the end of the channel of the adjacent deck; and
   an insulating layer between the given deck and the adjacent deck, wherein the insulating layer is thicker than an insulating layer between two adjacent tiers of memory cells, and wherein the insulating layer is at least partially over and in contact with a top surface of the conductive stop layer near sides of the conductive stop layer;

wherein a region of the insulating layer between the given deck and the adjacent deck is between the top surface of the conductive stop layer and the doped polycrystalline material.

* * * * *